United States Patent
Fujita et al.

(10) Patent No.: US 11,061,263 B2
(45) Date of Patent: Jul. 13, 2021

(54) TOUCH-PANEL-EQUIPPED DISPLAY DEVICE

(71) Applicant: SHARP KABUSHIKI KAISHA, Sakai (JP)

(72) Inventors: Tetsuo Fujita, Sakai (JP); Yoshimasa Chikama, Sakai (JP); Yoshihito Hara, Sakai (JP); Yukinobu Nakata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 312 days.

(21) Appl. No.: 16/321,410

(22) PCT Filed: Jul. 25, 2017

(86) PCT No.: PCT/JP2017/026835
§ 371 (c)(1),
(2) Date: Jan. 28, 2019

(87) PCT Pub. No.: WO2018/021291
PCT Pub. Date: Feb. 1, 2018

(65) Prior Publication Data
US 2021/0103350 A1      Apr. 8, 2021

(30) Foreign Application Priority Data

Jul. 28, 2016  (JP) .............................. JP2016-148462

(51) Int. Cl.
*G06F 3/045* (2006.01)
*G02F 1/1333* (2006.01)
(Continued)

(52) U.S. Cl.
CPC .......... *G02F 1/1333* (2013.01); *G02F 1/1368* (2013.01); *G02F 1/13338* (2013.01);
(Continued)

(58) Field of Classification Search
USPC ........ 345/174, 173, 156; 349/43; 257/57, 59
See application file for complete search history.

(56) References Cited

U.S. PATENT DOCUMENTS

| | | | |
|---|---|---|---|
| 7,868,960 B2* | 1/2011 | Tsubata | G02F 1/1368 349/43 |
| 10,727,255 B2* | 7/2020 | Nam | G02F 1/1337 |
| 2009/0261331 A1* | 10/2009 | Yang | H01L 29/4908 257/57 |
| 2010/0012939 A1* | 1/2010 | Ishii | H01L 27/124 257/59 |

(Continued)

FOREIGN PATENT DOCUMENTS

| | | |
|---|---|---|
| JP | 2014-226982 A | 12/2014 |
| JP | 2015-106411 A | 6/2015 |

(Continued)

*Primary Examiner* — Thuy N Pardo
(74) *Attorney, Agent, or Firm* — ScienBiziP, P.C.

(57) ABSTRACT

Provided is a touch-panel-equipped display device that can achieve a desired touch detection performance even if it has a large-size high-definition panel. The touch-panel-equipped display device of the present invention includes an active matrix substrate (1). The active matrix substrate (1) includes, on a substrate (40), a plurality of pixel electrodes, a plurality of counter electrodes (21), and an insulating film (46) provided between the pixel electrodes and the counter electrodes (21). The active matrix substrate (1) further includes a plurality of signal lines (22) each of which is connected with any one of the counter electrodes (21), a plurality of switching elements that are connected with the pixel electrodes, respectively, and an organic insulating film (45) that is provided between the pixel electrodes and the signal lines (22) as well as the switching elements. The signal lines (22) are in contact with the substrate (40).

2 Claims, 16 Drawing Sheets

(51) Int. Cl.
    *G06F 3/044*     (2006.01)
    *G02F 1/1343*     (2006.01)
    *G02F 1/1362*     (2006.01)
    *G02F 1/1368*     (2006.01)
    *G06F 3/041*     (2006.01)
    *H01L 27/12*     (2006.01)
    *H01L 29/786*     (2006.01)

(52) U.S. Cl.
    CPC .... *G02F 1/13439* (2013.01); *G02F 1/136227* (2013.01); *G06F 3/044* (2013.01); *G06F 3/0412* (2013.01); *G06F 3/0445* (2019.05); *H01L 27/1225* (2013.01); *H01L 27/1244* (2013.01); *H01L 29/7869* (2013.01)

(56) References Cited

U.S. PATENT DOCUMENTS

| | | |
|---|---|---|
| 2015/0145821 A1 | 5/2015 | Kim et al. |
| 2015/0177880 A1 | 6/2015 | Shin et al. |
| 2015/0331518 A1* | 11/2015 | Kaneko ............... G06F 3/0445 345/174 |
| 2016/0188040 A1 | 6/2016 | Shin et al. |
| 2016/0253030 A1* | 9/2016 | Tada .................. G06F 3/04166 345/174 |
| 2017/0192274 A1* | 7/2017 | Kaneko ............. G02F 1/136286 |
| 2019/0050090 A1* | 2/2019 | Kida .................... G06F 3/0412 |

FOREIGN PATENT DOCUMENTS

| | | |
|---|---|---|
| JP | 2015-122057 A | 7/2015 |
| JP | 2016-126778 A | 7/2016 |

\* cited by examiner

TOUCH-PANEL-EQUIPPED DISPLAY DEVICE

TECHNICAL FIELD

The present invention relates to a touch-panel-equipped display device.

BACKGROUND ART

JP-A-2015-122057 discloses a touch screen panel integrated display device that includes a panel that serves as both of a display and a touch screen. On the panel, a plurality of pixels are formed, and each pixel is provided with a pixel electrode, and a transistor connected to the pixel electrode. Further, on the panel, a plurality of electrodes are arranged apart from one another, so as to be opposed to the pixel electrodes. The plurality of electrodes function as common electrodes that form lateral electric fields (horizontal electric fields) between the same and the pixel electrodes in the display driving mode, and function as touch electrodes that form electrostatic capacitors between the same and a finger or the like in the touch driving mode. At least one signal line, approximately parallel with data lines, is connected to each of the plurality of electrodes, so that a touch driving signal or a common voltage signal is supplied thereto via the signal line. The pixel electrodes and the signal lines are formed in the same layer, and overlap with a plurality of electrodes with one insulating layer being interposed therebetween.

SUMMARY OF THE INVENTION

In a case where the structure disclosed in JP-A-2015-122057 is applied to a middle-size touch panel, it is difficult to achieve a response performance in touch detection at the same level as the level in the case of the small-size touch panel. Touch detection signal lines of the middle-size touch panel have a greater length as compared with touch detection signal lines of the small-size touch panel, thereby having greater resistances, which results in that capacitances between the signal lines and the touch detection electrodes become greater. Further, since a panel having a higher definition includes a greater number of pixels, capacitances between the signal lines and other elements become greater. In other words, as the size of the touch panel increases, the time constant during the touch detection period increases as the panel has a higher definition.

To achieve a touch detection performance at the same level as that of the small-size touch panel, such a configuration can be proposed that an insulating film between signal lines and touch detection electrodes has a greater thickness so that capacitances of the signal lines are reduced. As the time constant increases as the touch panel has a larger size or a greater resolution, however, it is difficult to make adjustment for achieving a desired touch detection performance by adjusting only the thickness of the insulating film between the signal lines and the touch detection electrodes.

It is an object of the present invention to provide a touch-panel-equipped display device that can achieve a desired touch detection performance even if it has a large-size high-definition panel.

A touch-panel-equipped display device in one embodiment of the present invention includes an active matrix substrate, wherein the active matrix substrate includes: a substrate; a plurality of pixel electrodes that are provided on the substrate; a plurality of counter electrodes that are arranged so as to overlap with the pixel electrodes on the substrate when viewed in a plan view; an insulating film that is provided between the pixel electrodes and the counter electrodes; a plurality of signal lines that are provided on the substrate, on a side opposite to the counter electrodes with respect to the pixel electrodes, each of the signal lines being connected with any one of the counter electrodes so that a touch driving signal is supplied to the signal lines; a plurality of switching elements that are connected with the pixel electrodes, respectively; and an organic insulating film that is provided between the pixel electrodes and the signal lines as well as the switching elements, wherein each of the signal lines is in contact with the substrate.

With the present invention, a desired touch detection performance can be achieved even with a large-size high-definition panel.

MODE FOR CARRYING OUT THE INVENTION

Figure 1:
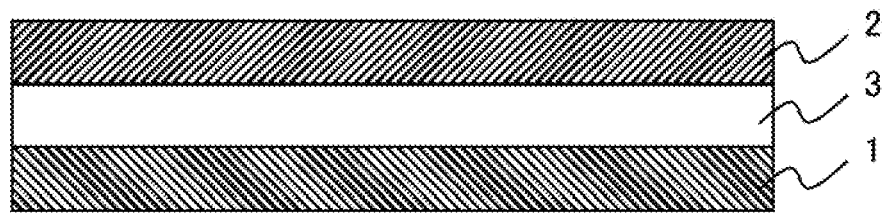
FIG. 1 is a cross-sectional view of a touch-panel-equipped display device in Embodiment 1.

A touch-panel-equipped display device in one embodiment of the present invention includes an active matrix substrate, wherein the active matrix substrate includes: a substrate; a plurality of pixel electrodes that are provided on the substrate; a plurality of counter electrodes that are arranged so as to overlap with the pixel electrodes on the substrate when viewed in a plan view; an insulating film that is provided between the pixel electrodes and the counter electrodes; a plurality of signal lines that are provided on the substrate, on a side opposite to the counter electrodes with respect to the pixel electrodes, each of the signal lines being connected with any one of the counter electrodes so that a touch driving signal is supplied to the signal lines; a plurality of switching elements that are connected with the pixel electrodes, respectively; and an organic insulating film that is provided between the pixel electrodes and the signal lines as well as the switching elements, wherein each of the signal lines is in contact with the substrate (the first configuration).

According to the first configuration, a plurality of pixel electrodes, a plurality of counter electrodes, an insulating film, a plurality of signal lines, an organic insulating film, and a plurality of switching elements connected with the pixel electrodes are provided on the substrate of the active matrix substrate. The signal lines are provided in contact with the substrate, on a side opposite to the counter electrodes with respect to the pixel electrodes, and each of the signal lines is connected with any one of the counter electrodes. An insulating film is provided between the pixel electrodes and the counter electrodes, and an organic insulating film is provided between the pixel electrodes and the signal lines as well as the switching elements. In other words, the insulating film and the organic insulating film are provided between the signal lines and the counter electrodes. The capacitances between the signal lines and the counter electrodes therefore can be reduced without adjusting the thickness of the insulating film between the signal lines and the counter electrodes, as compared with a case where the signal lines are provided in the same layer as that of the pixel electrodes. This therefore makes it possible to reduce the capacitances between the signal lines and the counter electrodes even if the signal lines have greater resistances in a case where this structure is applied to a large-size high-definition panel, and this makes it possible to prevent the time constant during touch detection from increasing. This allows a desired touch detection performance to be ensured.

The first configuration may be such that each of the switching elements includes a gate electrode, a source electrode, and a drain electrode; and the active matrix substrate further includes a first inorganic insulating film that covers each of the signal lines so as to be provided between the signal lines and the gate electrodes (the second configuration).

With the second configuration, short-circuiting between the signal lines and the gate electrodes can be prevented.

The second configuration may be such that the active matrix substrate further includes: a gate insulating film that covers the gate electrodes and the first inorganic insulating film; and a second inorganic insulating film that covers the source electrodes and the drain electrodes, and overlaps with the gate insulating film, wherein the organic insulating film is provided between the pixel electrodes and the second inorganic insulating film (the third configuration).

According to the third configuration, the second inorganic insulating film and the gate insulating film are further provided between the signal lines and the counter electrodes. This makes it possible to further reduce the capacitances between the signal lines and the counter electrodes, thereby further reducing the time constant during touch detection.

The second or third configuration may be such that the active matrix substrate further includes, at each of positions that overlap with the signal lines when viewed in a plan view: a first metal film that is made of the same material as that of the gate electrode; a second metal film that is in contact with the first metal film, and is made of the same material as that of the source electrode and the drain electrode; a first transparent electrode film that is in contact with the second metal film, and is made of the same material as that of the pixel electrodes; and a second transparent electrode film that is in contact with the first transparent electrode film, and is made of the same material as that of the counter electrodes, wherein each of the signal lines is in contact with the first metal film (the fourth configuration).

With the fourth configuration, connection parts between the signal lines and the counter electrodes can be formed by using a material that is used for forming the switching elements.

The following description describes embodiments of the present invention in detail, while referring to the drawings. Identical or equivalent parts in the drawings are denoted by the same reference numerals, and the descriptions of the same are not repeated. To make the description easy to understand, in the drawings referred to hereinafter, the configurations are simply illustrated or schematically illustrated, or the illustration of a part of constituent members is omitted. Further, the dimension ratios of the constituent members illustrated in the drawings do not necessarily indicate the real dimension ratios.

FIG. 1 is a schematic cross-sectional view of a touch-panel-equipped display device 10 in the present embodiment. The touch-panel-equipped display device 10 in the present embodiment includes an active matrix substrate 1, a counter substrate 2, and a liquid crystal layer 3 interposed between the active matrix substrate 1 and the counter substrate 2. Each of the active matrix substrate 1 and the counter substrate 2 includes a glass substrate that is substantially transparent (having high translucency). The counter substrate 2 includes color filters that are not illustrated. Further, though the illustration is omitted, the touch-panel-equipped display device 10 includes a backlight that is provided so as to extend in a surface direction of the active matrix substrate 1 on a side opposite to the liquid crystal layer 3 in FIG. 1.

The touch-panel-equipped display device 10 has a function of displaying an image, and at the same time, has a function of detecting a position that a user touches on the displayed image (touch position). This touch-panel-equipped display device 10 is a so-called in-cell type touch panel display device in which elements necessary for detecting a touch position are formed on the active matrix substrate 1.

In the case of the touch-panel-equipped display device 10, the method for driving liquid crystal molecules contained in the liquid crystal layer 3 is the horizontal electric field driving method. To realize the horizontal electric field driving method, the pixel electrodes and the counter electrodes (common electrodes) for forming electric fields are formed on the active matrix substrate 1.

Figure 2:
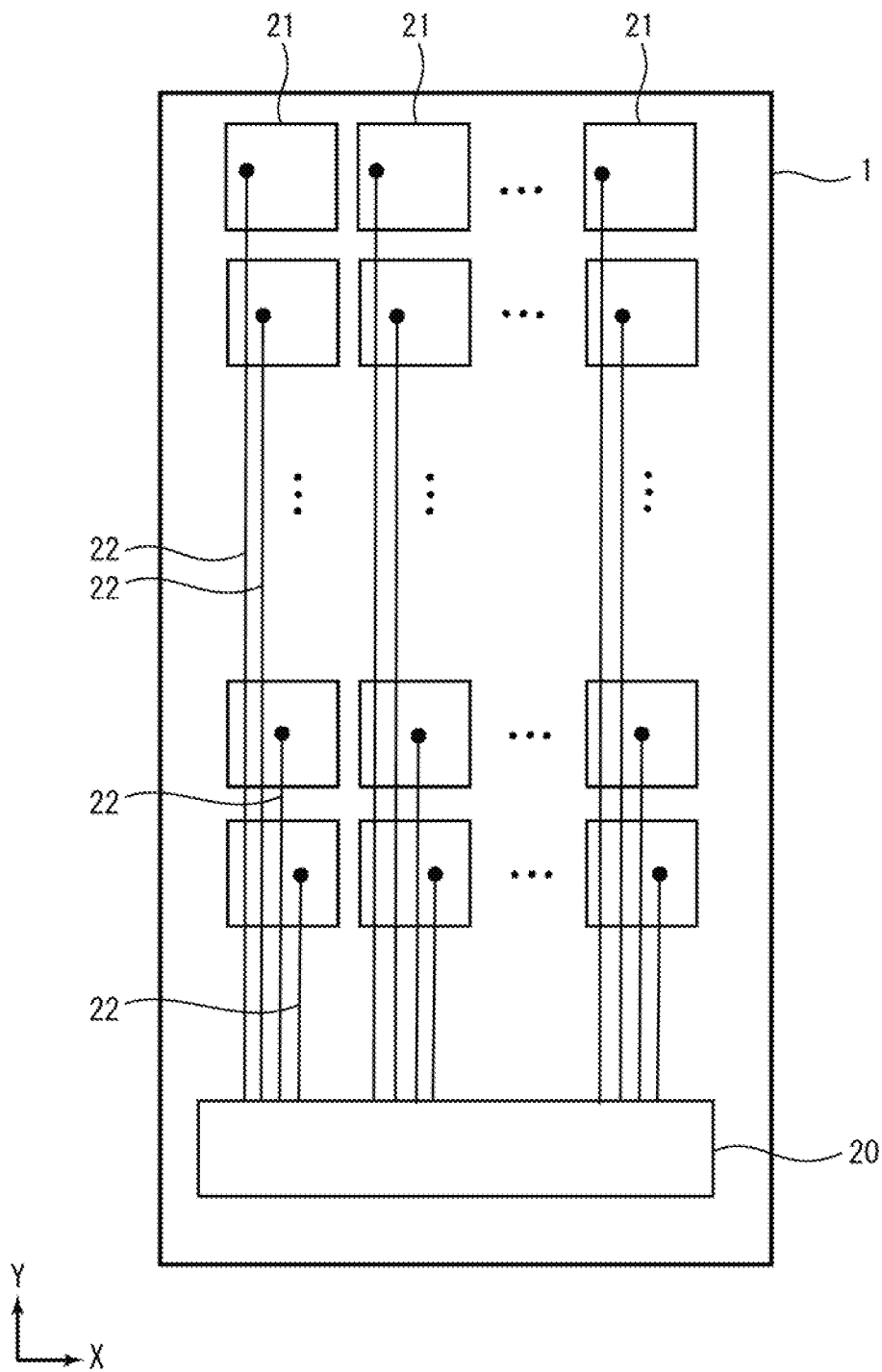
FIG. 2 schematically illustrates an exemplary arrangement of counter electrodes formed in the active matrix substrate illustrated in FIG. 1.

FIG. 2 schematically illustrates an exemplary arrangement of the counter electrodes 21 formed on the active matrix substrate 1. The counter electrodes 21 are formed on a liquid crystal layer 3 side surface of the active matrix substrate 1. As illustrated in FIG. 2, the counter electrode 21 is in a rectangular shape, and a plurality of the counter electrodes 21 are arrayed in matrix on the active matrix substrate 1. Each counter electrode 21 is in an approximately square shape whose side is approximately several millimeters. Though the illustration is omitted in this drawing, slits (having a width of, for example, several micrometers) for causing horizontal electric fields to be generated between the counter electrodes 21 and the pixel electrodes are formed in the counter electrodes 21.

On the active matrix substrate 1, a controller 20 is provided. The controller 20 performs a controlling operation for displaying an image, and performs a controlling operation for detecting a touch position.

The controller 20 and each counter electrode 21 are connected by signal lines 22 extending in the Y axis direction. More specifically, the same number of the signal lines 22 as the number of the counter electrodes 21 are formed on the active matrix substrate 1.

The counter electrodes 21 in pairs with the pixel electrodes are used during the controlling operation for displaying an image, and are also used during the controlling operation for detecting a touch position.

Regarding the counter electrodes 21, parasitic capacitances are formed between the same and adjacent ones of the counter electrodes 21 or the like. When a human finger or the like touches the display screen of the touch-panel-equipped display device 10, capacitors are formed between the same and the human finger or the like, and thereby electrostatic capacitances increase. During the control for touch position detection, the controller 20 supplies a touch driving signal for detecting a touch position, to the counter electrodes 21 through the signal lines 22, and receives a touch detection signal through the signal lines 22. By doing so, the controller 20 detects changes in the electrostatic capacitances at the positions of the counter electrodes 21, and detects a touch position. In other words, the signal lines 22 function as lines for the transmission/reception of the touch driving signal and the touch detection signal.

Figure 3:
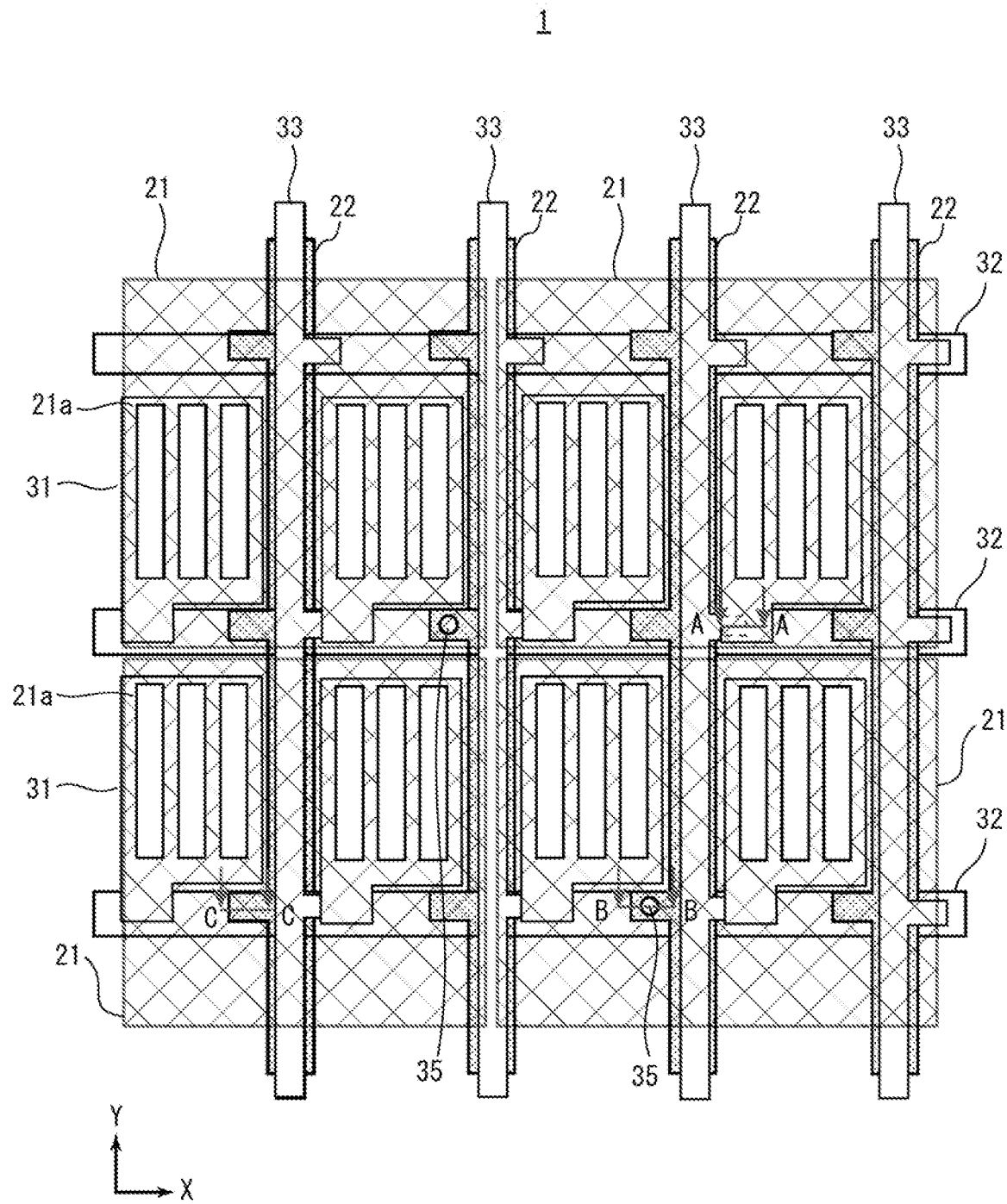
FIG. 3 is an enlarged schematic diagram illustrating a partial area of the active matrix substrate illustrated in FIG. 1.

FIG. 3 is an enlarged schematic diagram illustrating a partial area of the active matrix substrate 1. As illustrated in FIG. 3, a plurality of pixel electrodes 31 are arranged in matrix. Further, though the illustration is omitted in FIG. 3, thin film transistors (TFTs) as display control elements (switching elements) are also arranged in matrix in correspondence to the pixel electrodes 31, respectively. The counter electrodes 21 are provided with a plurality of slits 21a.

Around the pixel electrodes 31, the gate lines 32 and the source lines 33 are provided. The gate line 32 extends in the X axis direction, and a plurality of the same are arrayed at predetermined intervals in the Y axis direction. The source line 33 extends in the Y axis direction, and a plurality of the same are arrayed at predetermined intervals in the X axis direction. In other words, the gate lines 32 and the source lines 33 are formed in a lattice form, and the pixel electrodes 31 are provided in the areas defined by the gate lines 32 and the source lines 33, respectively. The gate electrode of each TFT is connected with the gate line 32, either the source electrode or the drain electrode of the TFT is connected with the source line 33, and the other one is connected with the pixel electrode 31.

On the counter substrate 2 (see FIG. 1), color filter of three colors of red (R), green (G), and blue (B) are provided so as to correspond to the pixel electrodes 31, respectively. With this configuration, each of the pixel electrodes 31 functions as a subpixel of any one of the colors of R, G, and B.

As illustrated in FIG. 3, the signal lines 22 extending in the Y axis direction are arranged so as to partially overlap, in the normal line direction of the active matrix substrate 1, with the source lines 33 extending in the Y axis direction. More specifically, the signal lines 22 are provided in a lower with respect to the source lines 33. Further, the signal lines 22 and the source lines 33 partially overlap with each other when viewed in a plan view, but the signal lines 22 are provided at positions that do not overlap with the TFTs.

In FIG. 3, white circles 35 indicate portions at which the counter electrodes 21 and the signal line 22 are connected with each other.

Though the illustration is omitted in FIGS. 2 and 3, the active matrix substrate 1 is provided with a gate driver that is connected with the gate lines 32 and scans the gate lines 32, and a source driver that is connected with the source lines 33 and supplies data signals indicating an image to the source lines 33. In the present embodiment, the image display control and the touch position detection control are performed in a divided manner during one vertical synchronization period. To the gate lines 32 and the source lines 33, voltage signals are supplied from the gate driver and the source driver, respectively, during the image display control period, but no voltage signal is supplied during the touch position detection control period.

Figure 4A:
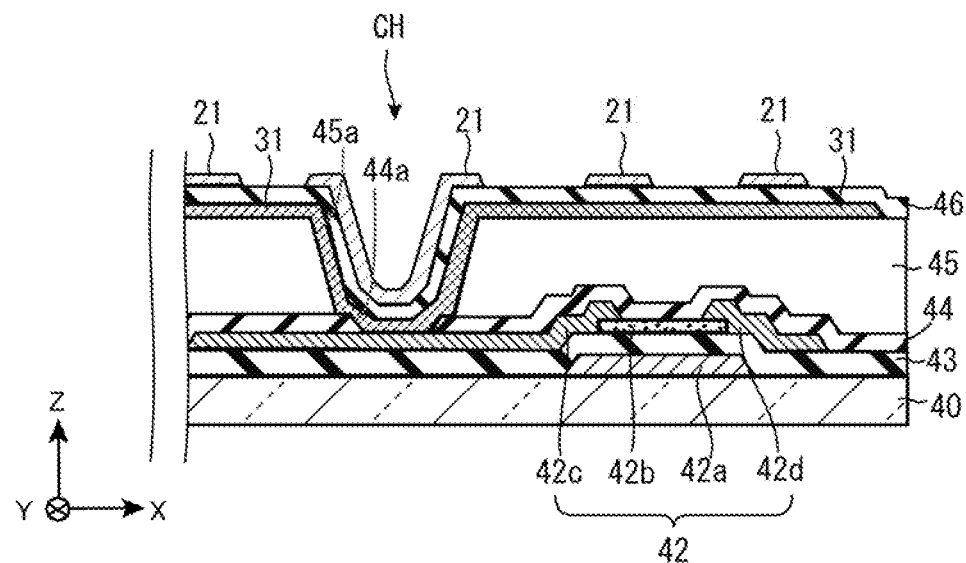
FIG. 4A is a schematic cross-sectional view of the active matrix substrate in a TFT area.
Figure 4B:
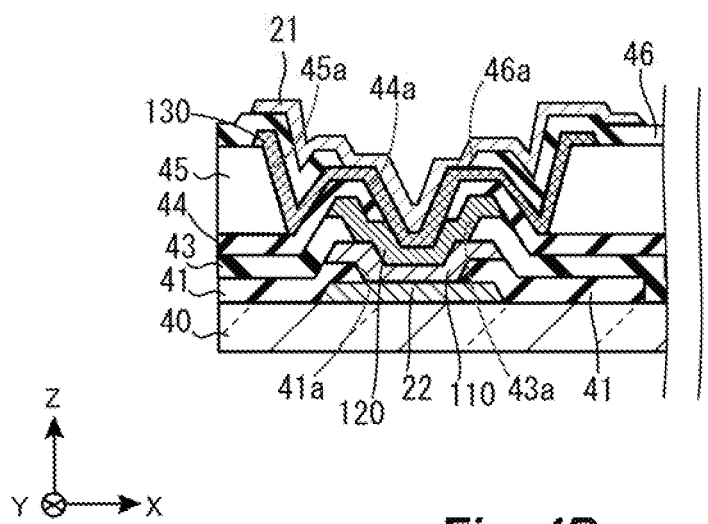
FIG. 4B is a schematic cross-sectional view of the active matrix substrate in a signal-line-connection area.
Figure 4C:
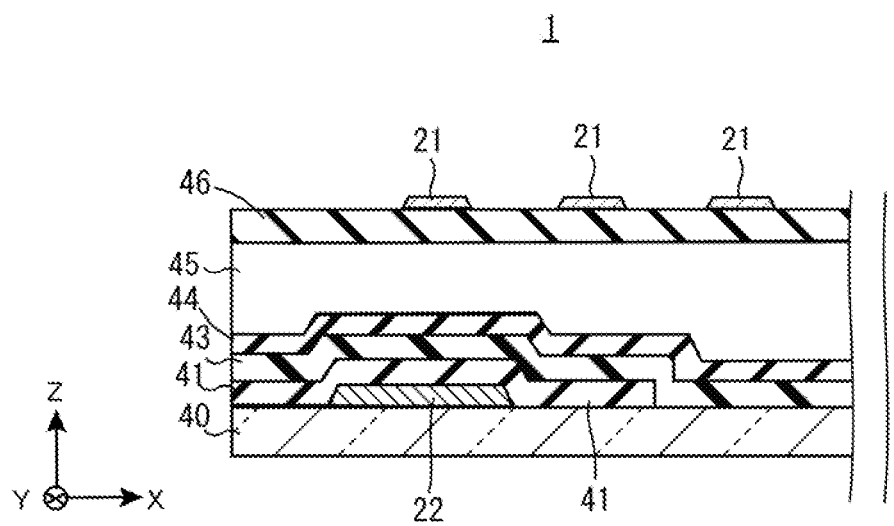
FIG. 4D is a schematic cross-sectional view of the active matrix substrate in a non-signal-line-connection area.

FIG. 4A is a cross-sectional view illustrating a cross section of the active matrix substrate 1 illustrated in FIG. 3, taken along line A-A, i.e., in the TFT area in which the TFT is arranged. Further, FIG. 4B is a cross-sectional view illustrating a cross section of the active matrix substrate 1 illustrated in FIG. 3, taken along line B-B, in the signal-line-connection area in which the signal line 22 is connected with the counter electrode 21. FIG. 4C is a cross-sectional view illustrating a cross section of the active matrix substrate 1 illustrated in FIG. 3, taken along line C-C, i.e., in the non-signal-line-connection area in which the signal line 22 is not connected with the counter electrode 21. The following description describes the cross-sectional structure in each area.

(TFT Area)

On the glass substrate 40 in the TFT area illustrated in FIG. 4A, a TFT 42 as a display control element is provided. The TFT 42 includes a gate electrode 42a, a semiconductor film 42b, a source electrode 42c, and a drain electrode 42d.

The gate electrode 42a of the TFT 42 is formed on the glass substrate 40. The gate electrode 42a is formed with, for example, a laminate film of titanium (Ti) and copper (Cu).

In FIG. 4A, on the gate electrode 42a, a gate insulating film 43 is formed. The gate insulating film 43 is formed by chemical vapor deposition (CVD) or the like. For forming the gate insulating film 43, for example, a silicon oxide ($SiO_2$) layer, a silicon nitride ($SiN_x$) layer, a silicon oxide nitride ($SiO_xN_y$; x>y) layer, or a silicon nitride oxide ($SiN_xO_y$; x>y) layer can be appropriately used. Further, the gate insulating film 43 may have a laminate structure. More specifically, for example, on the glass substrate 40 side (lower layer), a film of silicon nitride (SiNx) having a thickness of 200 to 500 nm may be formed so that impurities or the like should be prevented from being diffused from the glass substrate 40, and a film of silicon oxide ($SiO_2$) having a thickness 25 to 100 nm may be formed thereon.

On the gate insulating film 43, the semiconductor film 42b is formed. The semiconductor film 42b is, for example, an oxide semiconductor film, and may contain at least one metal element among In, Ga and Zn. In the present embodiment, the semiconductor film 42b contains, for example, an In—Ga—Zn—O-type semiconductor. Here, the In—Ga—Zn—O-type semiconductor is a ternary oxide of In (indium), Ga (gallium), and Zn (zinc), and the ratio of In, Ga and Zn (composition ratio) thereof is not limited particularly; examples of the ratio include In:GaZn=2:2:1, In:Ga:zN=1:1:1, and In:Ga:Zn=1:1:2. Alternatively, however, the semiconductor film 42b may be formed with indium tin zinc oxide (ITZO), low-temperature polysilicon (LTPS), continuous grain silicon (CGS), or amorphous silicon (a-Si).

The source electrode 42c and the drain electrode 42d are provided on the semiconductor film 42b so as to be positioned apart from each other. The source electrode 42c is formed integrally with the source line 33. The source electrode 42c and the drain electrode 42d are formed with, for example, laminate films made of titanium (Ti) and copper (Cu).

On the source electrode 42c and the drain electrode 42d, the semiconductor film 42b, as well as the gate insulating film 43, an inorganic insulating film 44 (second Inorganic insulating film) is formed. The inorganic insulating film 44 is divided and separated on the source electrode 42c, and has an opening 44a at the position of separation. The inorganic insulating film 44 is formed by, for example, CVD. The inorganic insulating film 44 may be formed as follows, for example: a silicon oxide ($SiO_2$) film is formed so as to have a thickness of 100 to 400 nm, and thereon, a silicon nitride ($SiN_x$) film is formed so as to have a thickness of 20 to 200 nm.

On the inorganic insulating film 44, an organic insulating film (flattening film) 45 is formed. The organic insulating film 45 is divided and separated on the inorganic insulating film 44, and has an opening 45a that is greater than the opening 44a, at the position of separation. With the openings 44a and 45a, a contact hole CH is formed on the source electrode 42c. The organic insulating film 45 may be formed by, for example, applying ultraviolet light curing resin so that the resin film has a thickness of 1 to 3 μm. By forming the organic insulating film (flattening film) 45, alignment irregularities of liquid crystal molecules that are caused by protrusions and recesses in the TFT portions can be suppressed. Further, parasitic capacitances between the gate lines 32 or the source lines 33 and the pixel electrodes 31 can be reduced.

On the organic insulating film 45, the pixel electrode 31 is provided. The pixel electrode 31 is connected with the source electrode 42c through the contact hole CH. The pixel electrode 31 is made of a material such as indium tin oxide (ITO), zinc oxide (ZnO), indium zinc oxide (IZO), indium gallium zinc oxide (IGZO), or ITZO.

An inorganic insulating film 46 is provided so as to cover the pixel electrode 31. The inorganic insulating film 40 is made of, for example, silicon nitride ($SiN_x$) or silicon dioxide ($SiO_2$). The inorganic insulating film 46 is preferably formed by, for example, CVD, with silicon nitride ($SiN_x$) so as to have a thickness of 100 nm to 400 nm.

The counter electrode 21 is formed on a part of the inorganic insulating film 46. The counter electrode 21 is made of a material such as ITO, ZnO, IZO, IGZO, or ITZO. (Signal-Line-Connection Area and Non-Signal-Line-Connection Area)

On the glass substrate 40 in FIGS. 4B and 4C, the signal line 22 is formed at a position that does not overlap with the gate electrode 42a in the TFT area. The signal line 22 is made of any one of, for example, copper (Cu), titanium (Ti), molybdenum (Mo), aluminum (Al), magnesium (Mg), cobalt (Co), chromium (Cr), and tungsten (W), or alternatively a mixture of any of these.

On the signal line 22 in FIGS. 4B and 4C, an inorganic insulating film 41 (first inorganic insulating film) is formed. More specifically, in the signal-line-connection area illustrated in FIG. 4B, the inorganic insulating film 41 is divided and separated on the signal line 22, and has an opening 41a at the position of separation. Further, in the non-signal-line-connection area illustrated in FIG. 4C, the inorganic insulating film 41 is provided so as to cover the signal line 22. The inorganic insulating film 41 is formed by, for example, CVD. For forming the inorganic insulating film 41, for example, silicon oxide ($SiO_2$), silicon nitride ($SiN_x$), silicon oxide nitride ($SiO_xN_y$; x>y), silicon nitride oxide ($SiN_xO_y$; x>y), or the like can be appropriately used. The inorganic insulating film 41 preferably has a thickness of 200 nm to 500 nm, and more preferably has a lower dielectric constant.

On the inorganic insulating film 41 illustrated in FIG. 4B, a metal film (gate layer) 110 made of the same material as that of the gate electrode 42a is formed. The metal film (gate layer) 110 is connected with the signal line 22 through the opening 41a of the inorganic insulating film 41.

In the signal-line-connection area illustrated in FIG. 4B, the gate insulating film 43 is formed on the inorganic insulating film 41, and metal film (gate layer) 110. In FIG. 4B, the gate insulating film 43 is divided and separated on the metal film (gate layer) 110, and has an opening 43a at the position of separation. Further, in the non-signal-line-connection area illustrated in FIG. 4C, the gate insulating film 43 is formed so as to cover the inorganic insulating film 41.

On the gate insulating film 43 and the metal film (gate layer) 110 illustrated in FIG. 4B, a metal film (source layer) 120 made of the same material as that of the source electrode 42c and the drain electrode 42d is formed at a position that overlaps with the signal line 22. The metal film (source layer) 120 is connected with the metal film (gate layer) 110 through the opening 43a of the gate insulating film 43.

In FIGS. 48 and 4C, on the gate insulating film 43, the inorganic insulating film 44 is formed. The inorganic insulating film 44 in FIG. 4B is divided and separated on the metal film (gate layer) 110, and has the opening 44a at the position of separation. In FIG. 4C, the inorganic insulating film 44 covers the gate insulating film 43.

On the inorganic insulating film 44 illustrated in FIGS. 4B and 4C, an organic insulating film (flattening film) 45 is formed. The organic insulating film 45 in FIG. 4B is divided and separated on the inorganic insulating film 44, and has the opening 45a at the position of separation. The organic insulating film 45 in FIG. 4C covers the inorganic insulating film 44.

In FIG. 4B, on the organic insulating film 45, a first transparent electrode film 130 made of the same material as that of the pixel electrode 31 is provided. The first transparent electrode film 130 is connected with the metal film (source layer) 120 through the openings 44a, 45a of the organic insulating film 45 and the inorganic insulating film 44.

In FIG. 4B, on the first transparent electrode film 130 and the organic insulating film 45, the inorganic insulating film 46, which is divided and separated on the first transparent electrode film 130 and has an opening 46a at the position of separation, is formed. Further, on the organic insulating film 45 in FIG. 4C, the inorganic insulating film 46 covering the organic insulating film 45 is formed.

On the inorganic insulating film 46 and the first transparent electrode film 130 in FIG. 4B, the counter electrode 21 is formed, and is connected with the first transparent electrode film 130 through the opening 46a. On the inorganic insulating film 46 in FIG. 4C, the counter electrode 21 covering the inorganic insulating film 46 is formed.

As illustrated in FIGS. 4B and 4C, in the present embodiment, the signal line 22 is provided in the bottommost layer in contact with the glass substrate 40. Then, as illustrated in FIG. 4C, in the non-signal-line-connection area, five insulating layers, i.e., the inorganic insulating film 46, the organic insulating film 45, the inorganic insulating film 44, the gate insulating film 43, and the inorganic insulating film 41, are provided between the counter electrode 21 and the pixel electrode 31. This makes it possible to reduce the capacitance between the signal line 22 and the counter electrode 21 without adjusting the thickness of the insulating film between the signal line 22 and the counter electrode 21, as compared with a case where the signal line 22 is provided in the same layer as that where the pixel electrode 31 is provided. Even if the present structure is applied to a large-size high-definition panel, which causes the signal line 22 to have a greater resistance, the capacitance of the signal line 22 can be therefore reduced, which results in that the time constant during the touch detection does not increase, whereby a desired touch detection performance can be ensured. Incidentally, as illustrated in FIG. 3, the signal line 22 overlaps with the source line 33 when viewed in a plan view, but during the touch position detection control, no data signal is supplied to the source line 33, since the image display control and the touch position detection control are performed in a time-division manner in one vertical synchronization period in the present embodiment. During the touch position detection, therefore, substantially no capacitance is generated between the source line 33 and the signal line 22, and the touch detection performance is not affected.

Figure 5A:
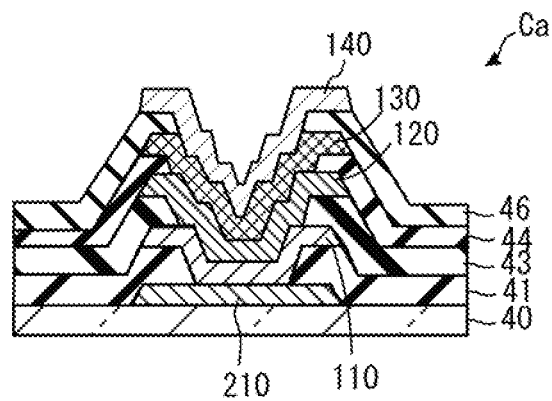
FIG. 5A illustrates a structure of a first terminal part in the active matrix substrate illustrated in FIG. 1.
Figure 5B:
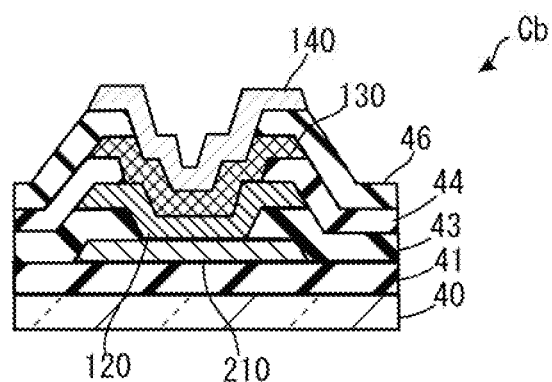
FIG. 5B illustrates a structure of a second terminal part in the active matrix substrate illustrated in FIG. 1.
Figure 5C:
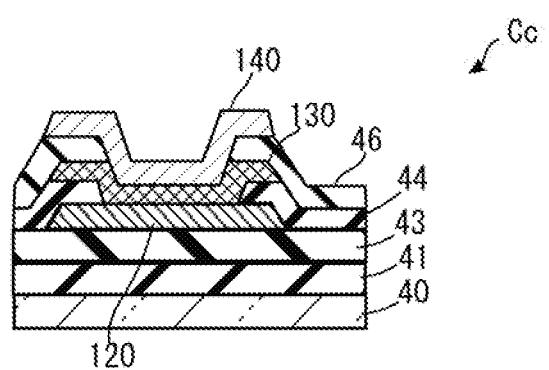
FIG. 5C illustrates a structure of a third terminal part in the active matrix substrate illustrated in FIG. 1.

Here, the structure of the terminal part provided in the active matrix substrate 1 is illustrated in FIGS. 5A to 5C. FIG. 5A illustrates the structure of a terminal part for connecting the signal line 22 and the controller 20 (hereinafter referred to as a first terminal part). FIG. 5B illustrates the structure of a terminal part for connecting the gate line 32 and the gate driver (hereinafter referred to as a second terminal part). FIG. 5C illustrates the structure of a terminal part for connecting the source line 33 and the source driver (hereinafter referred to as a third terminal part).

As illustrated in FIG. 5A, in the first terminal part Ca, a metal film 210 is formed on the glass substrate 40, the metal film 210 being made of the same material as that of the signal line 22. The metal film 210 is connected with the signal line 22.

On a part of the glass substrate 40 and the metal film 210, the inorganic insulating film 41 is formed. The inorganic insulating film 41 is divided and separated on the metal film 210.

On the metal film 210 and the inorganic insulating film 41, the metal film (gate layer) 110 is formed, and the metal film (gate layer) 110 and the metal film 210 are connected in a portion where the inorganic insulating film 41 is divided and separated.

On a part of the inorganic insulating film 41 and the metal film (gate layer) 110, the gate insulating film 43 is formed. The gate insulating file 43 is divided and separated on the metal film (gate layer) 110.

On a part of the metal film (gate layer) 110 and the gate insulating film 43, the metal film (source layer) 120 is formed, and the metal film (source layer) 120 and the metal film (gate layer) 110 are connected with each other in a portion where the gate insulating film 43 is divided and separated.

On a part of the gate insulating film 43 and the metal film (source layer) 120, the inorganic insulating film 44 is formed. The inorganic insulating film 44 is divided and separated on the metal film (source layer) 120.

On a part of the metal film (source layer) 120 and the inorganic insulating film 44, the first transparent electrode film 130 is formed. The first transparent electrode film 130 is connected with the metal film (source layer) 120 in a portion where the inorganic insulating film 44 is divided and separated.

On a part of the inorganic insulating film 44 and the first transparent electrode film 130, the inorganic insulating film 46 is formed. The inorganic insulating film 46 is divided and separated on the first transparent electrode film 130.

On a part of the first transparent electrode film 130 and the inorganic insulating film 46, the second transparent electrode film 140, which is made of the same material as that of the counter electrode 21, is formed. The second transparent electrode film 140 is connected with the first transparent electrode film 130 in a portion where the inorganic insulating film 46 is divided and separated.

In this way, the first terminal part Ca, to which controller 20 is connected, is connected with the signal line 22 via the metal film 210, the metal film (gate layer) 110, the metal film (source layer) 120, the first transparent electrode film 130, and the second transparent electrode film 140.

The second terminal part Cb illustrated in FIG. 5B has a structure that is different from the structure of the first terminal part Ca illustrated in FIG. 5A in the point that the metal film 210, which is made of the same material as that of the signal line 22, is not provided on the glass substrate 40.

More specifically, in the second terminal part Cb, the inorganic insulating film 41 is formed on the glass substrate 40, and the metal film (gate layer) 110 is formed on the inorganic insulating film 41. The metal film (gate layer) 110 is connected with the gate line 32. The metal film (gate layer) 110, the metal film (source layer) 120, the first transparent electrode film 130, and the second transparent electrode film 140 are connected to the second terminal part Cb, to which the gate driver is connected, and the second terminal part Cb is connected with the gate line 32 via these films.

The third terminal part Cc illustrated in FIG. 5C has a structure that is different from the structure of the second terminal part Cb illustrated in FIG. 5B in a point that the metal film (gate layer) 110 is not provided.

More specifically, in the third terminal part Cc, the gate insulating film 43 is formed on the inorganic insulating film 41 formed on the glass substrate 40, and the metal film (source layer) 120 is formed on the gate insulating film 43. The metal film (source layer) 120 is connected with the source line 33. The metal film (source layer) 120, the first transparent electrode film 130, and the second transparent electrode film 140 are connected to the third terminal part Cc, to which the source driver is connected, and the third terminal part Cc is connected with the source line 33 via these films.

Incidentally, in the example described above, the terminals parts to which the gate driver and the source driver are connected have respective different structures, but they may have uniform structures that are the same as the structure of the second terminal part Cb or the third terminal part Cc. For example, in a case where the terminal part to which the source driver is connected has the same structure as that of the second terminal part Cb, a connection part for connecting the second terminal part Cb and the source line 33 is needed. Further, in a case where the terminal part to which the gate driver is connected has the same structure as that of the third terminal part Cc, a connection part for connecting the third terminal part Cc and the gate line 32 is needed. In other words, this connection part is a connection part for connecting the metal film (gate layer) 110 and the metal film (source layer) 120.

Figure 5D:
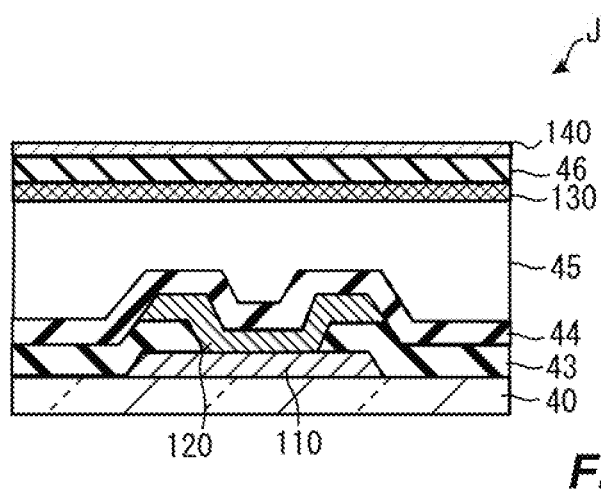
FIG. 5D is a cross-sectional view illustrating a structure of a connection part that connects a gate layer and a source layer in the active matrix substrate illustrated in FIG. 1.

FIG. 5D is a cross-sectional view illustrating a structure of such a connection part. As illustrated in FIG. 5D, in a connection part J, the metal film (gate layer) 110 is formed on the glass substrate 40, and the gate insulating film 43 is formed on the glass substrate 40 and the metal film (gate layer) 110. The gate insulating film 43 is divided and separated on the metal film (gate layer) 110.

On a part of the metal film (gate layer) 110 and the gate insulating film 43, the metal film (source layer) 120 is formed, and the metal film (source layer) 120 and the metal film (gate layer) 110 are connected with each other in a portion where the gate insulating film 43 is divided and separated.

On the gate insulating film 43 and the metal film (source layer) 120, the inorganic insulating film 44 is formed, and on the inorganic insulating film 44, the organic insulating film 45 is formed. Then, the first transparent electrode film 130 is formed on the organic insulating film 45, the inorganic insulating film 46 is formed on the first transparent electrode film 130, and the second transparent electrode film 140 is formed on the inorganic insulating film 46.

In this way, in the connection part J, the metal Film (source layer) 120 and the metal film (gate layer) 110 are connected with each other. In a case where the source driver is connected to a terminal part identical to the second terminal part Cb, therefore, the metal film (source layer) 120 in the connection part J is connected with the source line 33, and the metal film (gate layer) 110 in the connection part J and the metal film (gate layer) 110 in the second terminal part Cb are connected. With this configuration, the source driver is connected with the source line 33 via the second terminal part Cb and the connection part J. Further, in a case where the gate driver is connected with a terminal part identical to the third terminal part Cc, the metal film (gate layer) 110 in the connection part j is connected with the gate line 32, and the metal film (source layer) 120 in the connection part J and the metal film (source layer) 120 in the second terminal part Cb are connected with each other. With this configuration, the gate driver is connected with the gate line 32 via the third terminal part Cc and the connection part J.

FIGS. 6A to 6J are diagrams for explaining a process for producing the active matrix substrate 1 in the present embodiment. FIGS. 6A to 6J are cross-sectional views illustrating respective steps in the signal-line-connection area, the TFT area, the non-signal-line-connection area, and the terminal part area in which the terminal parts are formed.

First, on the glass substrate 40, for example, a metal film containing copper (Cu) is formed, and the metal film is patterned by using photolithography and wet etching. Through these steps, the signal line 22 is formed in the signal-line-connection area and the non-signal-line-connection area, and the metal film 210 is formed in the terminal part area (see FIG. 6A).

Figure 6A:
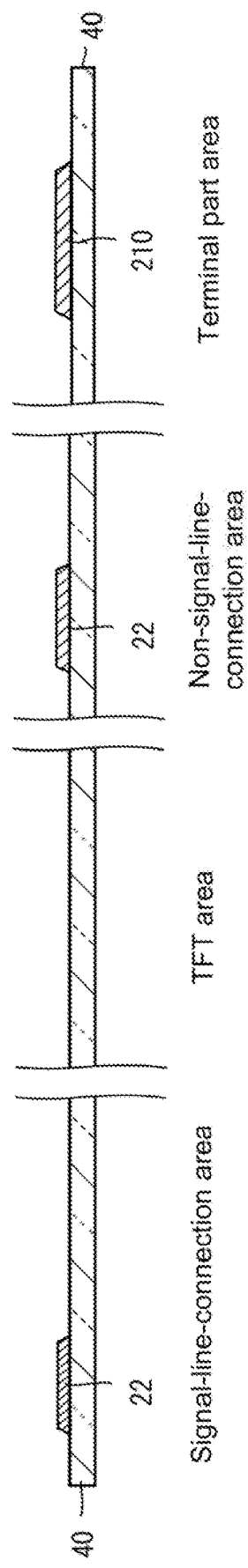
FIG. 6A is a cross-sectional view for explaining a process of producing a signal-line-connection area, a TFT area, a non-signal-line-connection area, and a terminal part area of the active matrix substrate illustrated in FIG. 1, which illustrates a step of forming signal lines in the signal-line-connection area and the non-signal-line-connection area, and a metal film in the terminal part area.

Next, for example, an inorganic insulating film containing silicon oxide ($SiO_2$) is formed so as to cover the signal line 22 and the metal film 210 illustrated in FIG. 6A, and the inorganic insulating film is patterned by using photolithography and dry etching. Through these steps, the inorganic insulating film 41 is formed on the signal line 22 in the signal-line-connection area and the non-signal-line-connection area, and on the metal film 210 in the terminal part area. In each of the signal-line-connection area and the terminal part area, the inorganic insulating film 41 is divided and separated on the signal lines 22 and the metal films 210, and the opening 41a is formed at the position of separation. In the non-signal-line-connection area, the signal line 22 is covered with the inorganic insulating film 41 (see FIG. 6B).

Figure 6B:
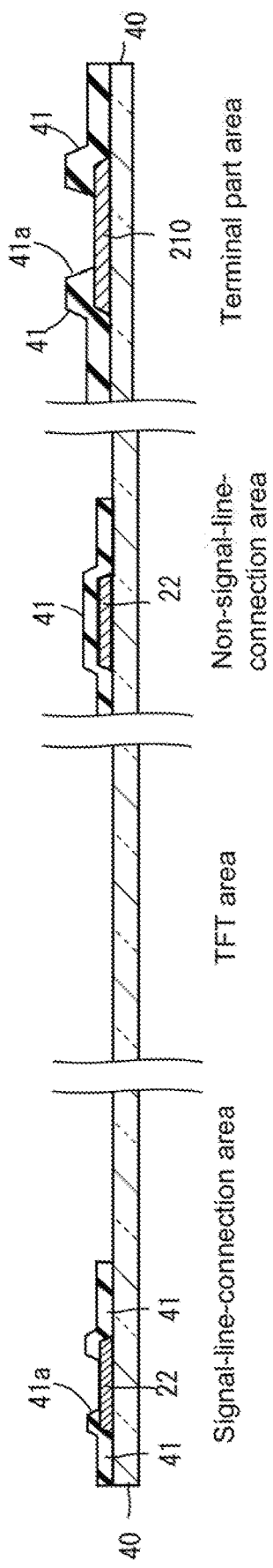
FIG. 6B is a cross-sectional view illustrating a step of forming an inorganic insulating film in the areas other than the TFT area illustrated in FIG. 6A.
Figure 6C:
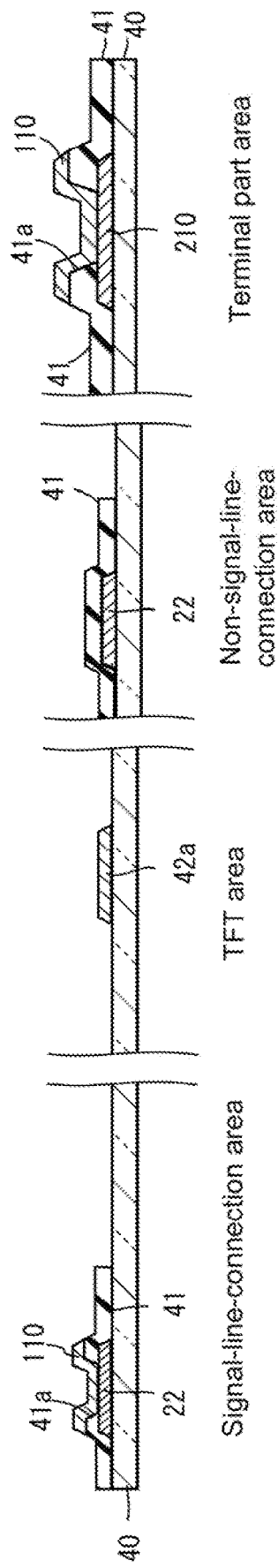
FIG. 6C is a cross-sectional view illustrating a step of forming a metal film (gate layer) in the signal-line-connection area and the terminal part area illustrated in FIG. 6B, and forming a gate electrode in the TFT area.

Next, for example, films of titanium (Ti) and copper (Cu) are sequentially formed so as to cover the inorganic insulating film 41 illustrated in FIG. 6B, and the laminate film of titanium and copper is patterned by using photolithography and wet etching. Through these steps, the metal film (gate layer) 110 is formed on the inorganic insulating film 41 in the signal-line-connection area, and the gate electrode 42a is formed on the glass substrate 40 in the TFT area. In the signal-line-connection area, the metal film (gate layer) 110 is connected with the signal line 22 through the opening 41a. Further, the metal film (gate layer) 110 is formed on the inorganic insulating film 41 in the terminal part area, and the metal film 210 and the metal film (gate layer) 110 are connected with each other through the opening 41a (see FIG. 6C).

Next, a gate insulating film containing, for example, silicon nitride ($SiN_x$) is formed so as to cover the metal film (gate layer) 110 and the gate electrode 42a illustrated in FIG. 60, and thereafter, for example, an In—Ga—Zn—O-type semiconductor film is formed. Then, photolithography and wet etching are performed so as to pattern the gate insulating film and the semiconductor film. Through these steps, the gate electrode 42a in the TFT area is covered with the gate insulating film 43, and the semiconductor film 42b is formed at a position that overlaps with the gate electrode 42a. Further, the gate insulating film 43 is formed, divided, and separated on the metal film (gate layer) 110 in the signal-line-connection area, and the opening 43a is formed at the position of separation. The gate insulating film 43 is formed on the inorganic insulating film 41 in the non-signal-line-connection area. Further, the gate insulating film 43 is formed, divided, and separated on the metal film (gate layer) 110 in the terminal part area, and the opening 43a is formed at the position of separation (see FIG. 6D).

Figure 6D:
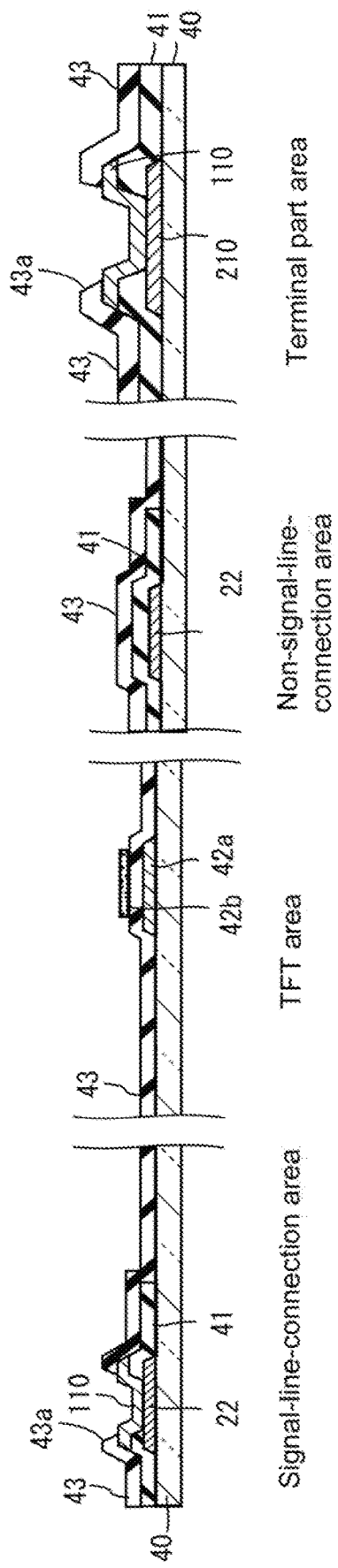
FIG. 6D is a cross-sectional view illustrating a step of forming a gate insulating film in the areas illustrated in FIG. 6C, and forming a semiconductor film in the TFT area.

Subsequently, for example, films of titanium (Ti) and copper (Cu) are sequentially formed so as to cover the gate insulating film 43 illustrated in FIG. 6D, and photolithography and wet etching are performed so as to pattern the laminate film of titanium and copper. Through these steps, the source electrode 42c integrated with the source line 33, and the drain electrode 42d, which are positioned apart from each other on the semiconductor film 42b in the TFT area, are formed. Besides, the metal film (source layer) 120 connected with the metal film (gate layer) 110 through the openings 43a is formed on the gate insulating film 43 in the signal-line-connection area and the terminal part area (see FIG. 6E).

Figure 6E:
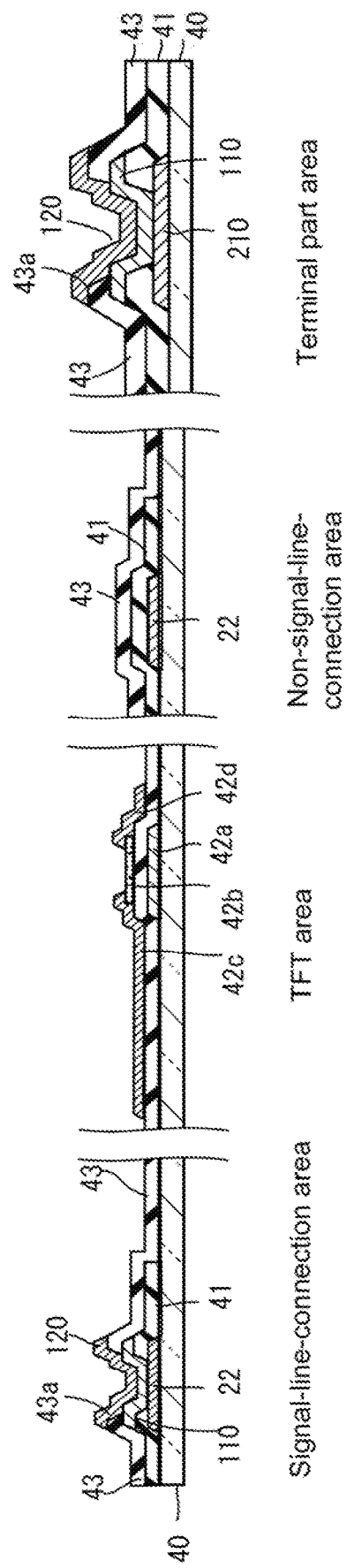
FIG. 6E is a cross-sectional view illustrating a step of forming a source electrode and a drain electrode in the TFT area illustrated in FIG. 6D, and forming a metal film (source layer) in the signal-line-connection area and the terminal part area.

Next, the inorganic insulating film 44 containing, for example, silicon nitride (SiN$_x$) is formed so as to cover the metal film (source layer) 120, the source electrode 42c and the drain electrode 42d illustrated in FIG. 6E. Thereafter, the organic insulating film 45 made of, for example, polymethyl methacrylate resin (PMMA) is formed, and photolithography and post-baking are performed so as to pattern the organic insulating film 45. Through these steps, the inorganic insulating film 44 is formed on the metal film (source layer) 120 in the signal-line-connection area, as well as on the source electrode 42c and the drain electrode 42d in the TFT area. Further, on the inorganic insulating film 44, an organic insulating film 45 is formed so as to be divided and separated at positions that overlap with the source electrode 42c, and the opening 45a is formed at each of the positions of separation. In the non-signal-line-connection area, the inorganic insulating film 44 is formed on the gate insulating film 43, and the organic insulating film 45 is formed on the inorganic insulating film 44. On the metal film (source layer) 120 and the gate insulating film 43 in the terminal part area, the inorganic insulating film 44 is formed (see FIG. 6F).

Figure 6F:
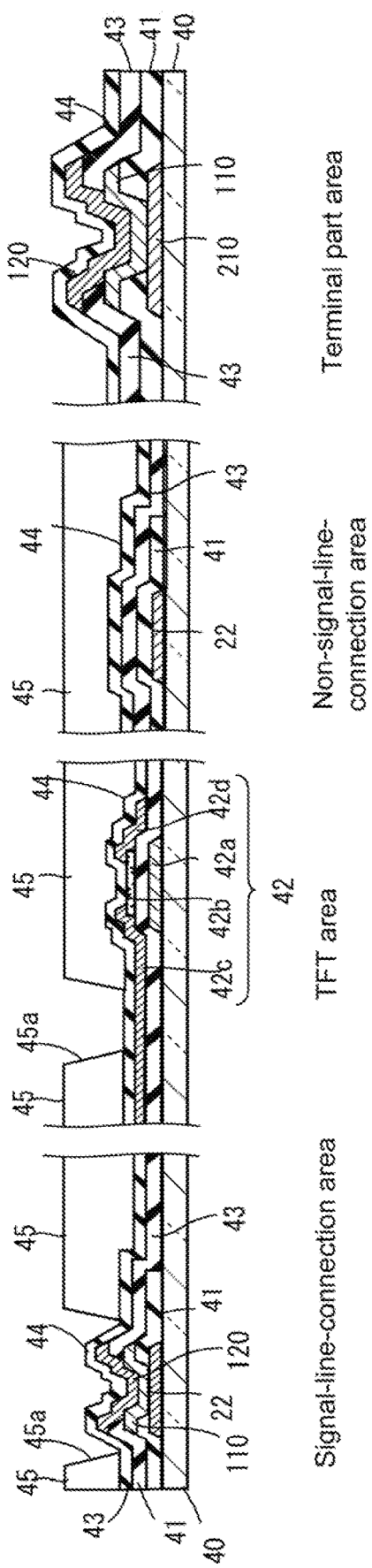
FIG. 6F is a cross-sectional view illustrating a step of forming an inorganic insulating film in the areas illustrated in FIG. 6E, and forming an organic insulating film in the areas other than the terminal part area.

Subsequently, in FIG. 6F, the inorganic insulating film 44 arranged on a part of the metal film (source layer) 120 in the signal-line-connection area and a part of the source electrode 42c in the TFT area, and a part of the metal film (source layer) 120 in the terminal part area is etched by using photolithography. Through these steps, openings 44a that partially expose the surfaces of the metal film (source layer) 120 and the source electrode 42c are formed in the signal-line-connection area and the TFT area, and in the TFT area, the contact hole CH composed of the openings 45a, 44a is formed on the source electrode 42c. Further, in the terminal part area, the opening 44a that partially exposes the surface of the metal film (source layer) 120 is formed (see FIG. 6G).

Figure 6G:
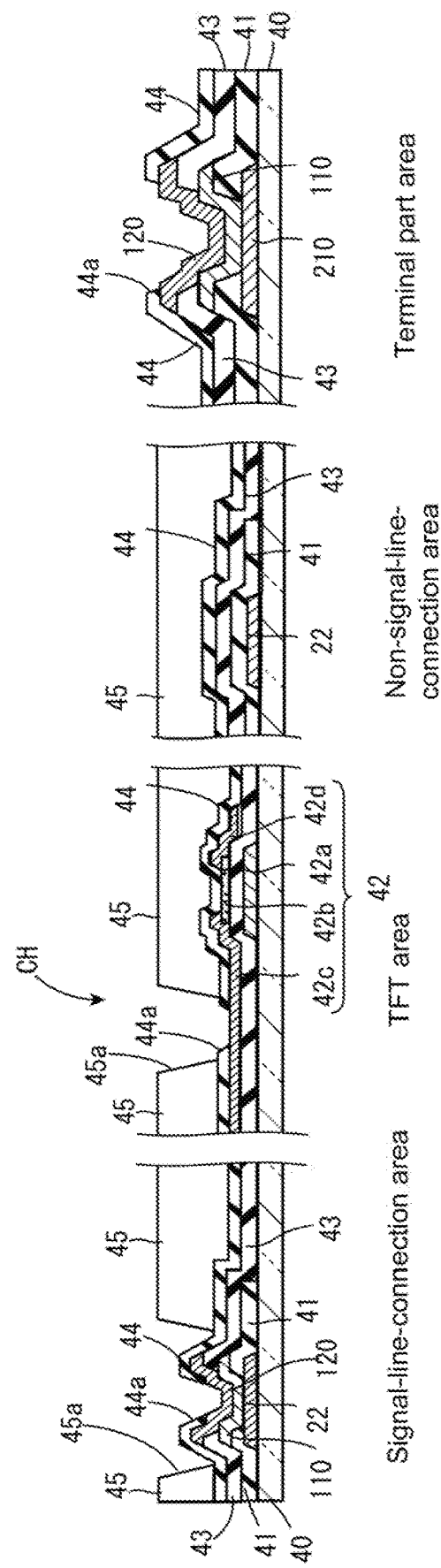
FIG. 6G is a cross-sectional view illustrating a step of forming openings in the inorganic insulating film in the areas other than the non-signal-line-connection area illustrated in FIG. 6F.

Next, a transparent electrode film containing, for example, ITO is formed so as to cover the organic insulating film 45 illustrated in FIG. 6G, and photolithography and wet etching are performed so as to pattern the transparent electrode film. Through these steps, the pixel electrode 31 is formed on the TFT 42 in the TFT area, and the source electrode 42c and the pixel electrode 31 are connected via the contact hole CH. Further, on the inorganic insulating film 44, the organic insulating film 45, and the metal film (source layer) 120 in the signal-line-connection area, the first transparent electrode film 130 is formed, and the metal film (source layer) 120 and the first transparent electrode film 130 are connected via the opening 44a. On the inorganic insulating film 44 and the metal film (source layer) 120 in the terminal part area, the first transparent electrode film 130 connected with the metal film (source layer) 120 via the opening 44a is formed (see FIG. 6H).

Figure 6H:
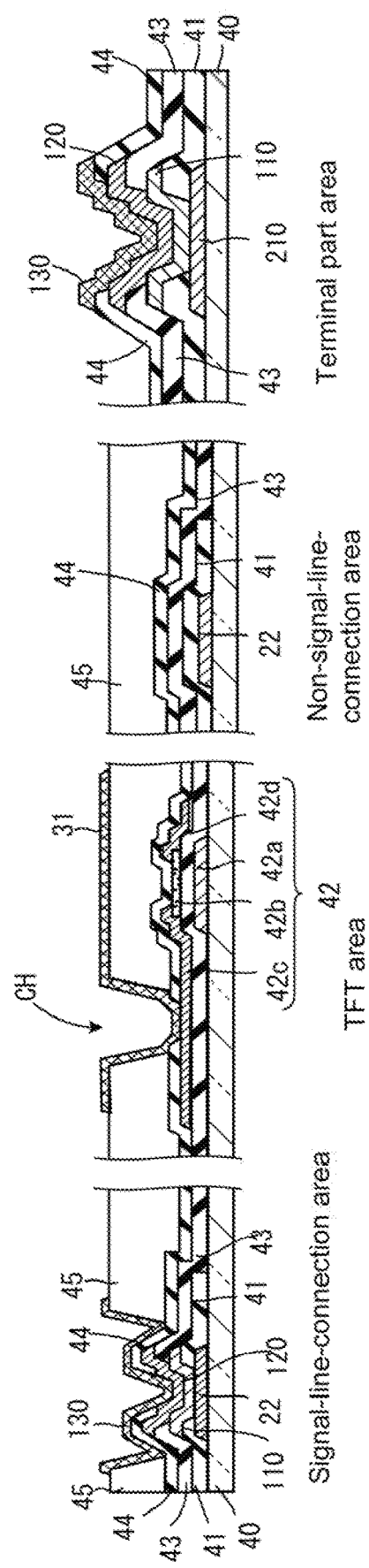
FIG. 6H is a cross-sectional view illustrating a step of forming a pixel electrode in the signal-line-connection area and the TFT area illustrated in FIG. 6G, and forming a first transparent electrode film in the terminal part area.

Subsequently, an inorganic insulating film containing, for example, silicon nitride (SiN$_x$) is formed so as to cover the pixel electrode 31 and the first transparent electrode film 130 illustrated in FIG. 6H, and photolithography and dry etching are performed so as to pattern the inorganic insulating film. Through these steps, in the signal-line-connection area, the inorganic insulating film 46 is formed so as to be divided and separated on the first transparent electrode film 130, and the opening 46a is formed at the position of separation. In the TFT area, the inorganic insulating film 46 covering the pixel electrode 31 is formed. In the non-signal-line-connection area, the inorganic insulating film 46 covering the organic insulating film 45 is formed. In the terminal part area, the inorganic insulating film 46 is formed so as to be divided and separated on the first transparent electrode film 130, and the opening 46a is formed at the position of separation (see FIG. 6I).

Figure 6I:
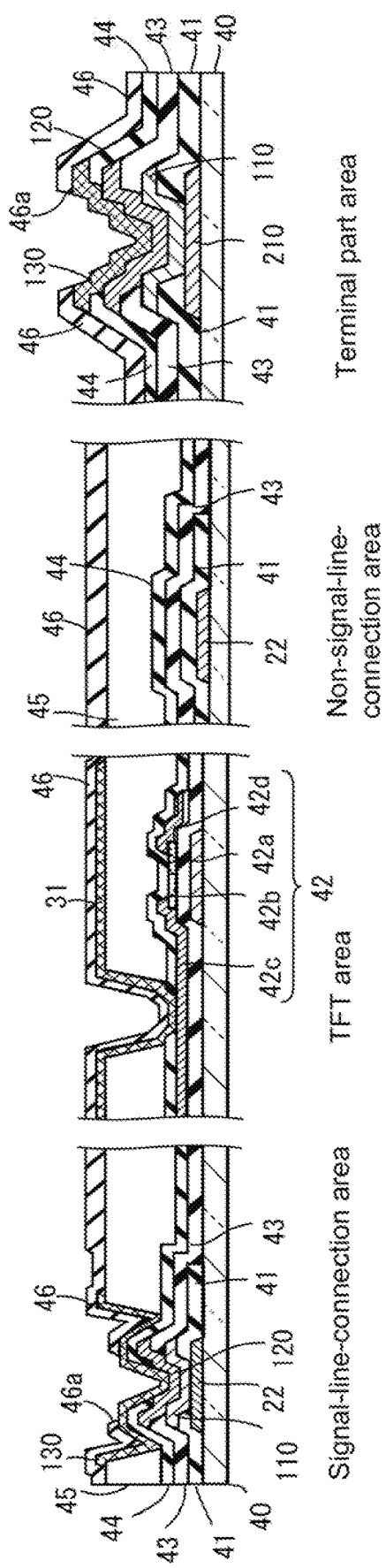
FIG. 6I is a cross-sectional view illustrating a step of forming an inorganic insulating film in the areas illustrated in FIG. 6H.
Figure 6J:
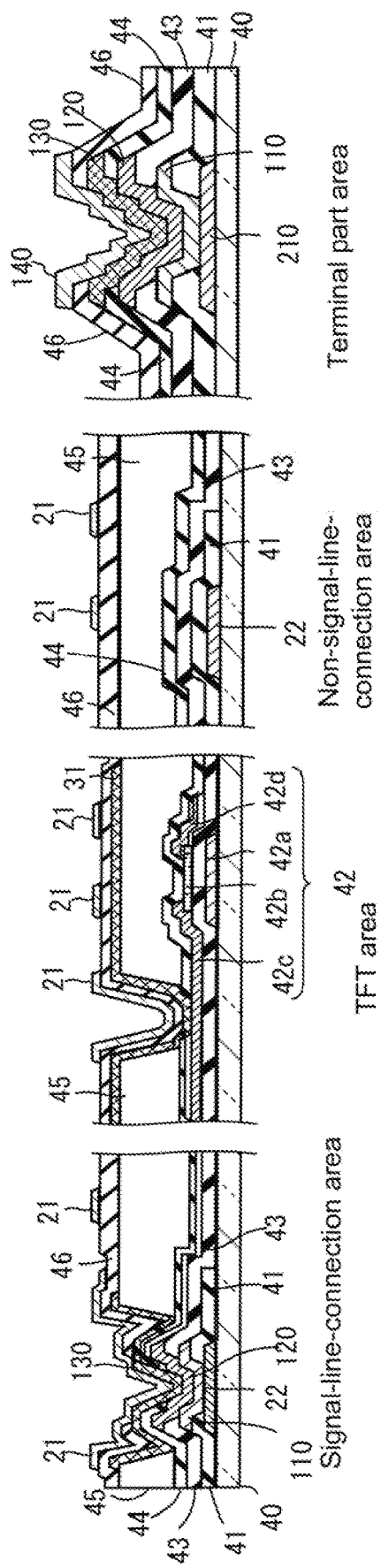
FIG. 6J is a cross-sectional view illustrating a step of forming a counter electrode in the signal-line-connection area, the TFT area, and the non-signal-line-connection area illustrated in FIG. 6I, and forming a second transparent electrode film in the terminal part area.

Next, a transparent electrode film containing, for example, ITO is formed on the inorganic insulating film 46 illustrated in FIG. 6I, and photolithography and wet etching are performed so as to pattern the transparent electrode film. Through these steps, the counter electrode 21 is formed on the inorganic insulating film 46 in the signal-line-connection area, the TFT area, and the non-signal-line-connection area. The counter electrode 21 in the signal-line-connection area is connected with the first transparent electrode film 130 via the opening 46a. On the inorganic insulating film 46 in the terminal part area, the second transparent electrode film 140 in contact with the first transparent electrode film 130 via the opening 46a is formed (see FIG. 6J).

In this way, in the process for producing the active matrix substrate 1 in the present embodiment, the films used for forming TFT area other than the inorganic insulating film 41, that is, the gate insulating film 43, the inorganic insulating film 44, the organic insulating film 45, and the inorganic insulating film 46, are formed between the signal line 22 and the counter electrode 21. As a result, such a structure that the signal line 22 is arranged in the bottommost layer so that the capacitance between the signal line 22 and the counter electrode 21 can be further reduced can be created in the step of forming the TFT area. Further, the organic insulating film 45 provided between the signal line 22 and the counter electrode 21 has a thickness greater than the thickness of the other insulating films. This makes it possible to reduce the capacitance between the signal line 22 and the counter electrode 21 sufficiently, only with the respective thicknesses that the insulating films have when the TFT area is formed.

The foregoing description describes an example of the touch-panel-equipped display device according to the present invention, but the configuration of the touch-panel-equipped display device according to the present invention is not limited to the above-described configuration of the embodiment, but may have any one of a variety of modified configurations. The following description describes the modification examples.

MODIFICATION EXAMPLE 1

In the above-described embodiment, an etching stopper layer may be provided between the source electrode 42c and the drain electrode 42d of the TFT 42. This configuration makes it possible to prevent the semiconductor film 42b from being damaged by etching that is performed when the source electrode 42c, the drain electrode 42d, and the like are formed.

MODIFICATION EXAMPLE 2

The above-described embodiment is described with reference to an exemplary configuration in which the TFTs of the bottom gate type are used, but the TFTs may be of the top gate type. Further, the semiconductor film 42b is not limited to the oxide semiconductor film, but may be an amorphous silicon film.

MODIFICATION EXAMPLE 3

In the above-described embodiment, the TFTs 42 used for display and the signal lines 22 are provided at such positions that these do not overlap with each other when viewed in a plan view, which allows parasitic capacitances between the signal lines 22 and the TFTs 42 to be reduced. The TFTs 42 and the signal lines 22, however, may be arranged so as to overlap with each other when viewed in a plan view, for example, in such a manner that the signal lines 22 are arranged in a lower layer of the TFTs 42.

MODIFICATION EXAMPLE 4

In the above-described embodiment, the gate electrode 42*a* is provided a position closer to the glass substrate 40, than the inorganic insulating film 41 is, but the configuration may be, for example, such that the inorganic insulating film 41 is provided below the gate electrode 42*a*, that is, on the glass substrate 40 side.

The invention claimed is:

1. A touch-panel-equipped display device comprising an active matrix substrate, the active matrix substrate includes:
   a substrate;
   a plurality of pixel electrodes that are provided on the substrate;
   a plurality of counter electrodes that are arranged so as to overlap with the pixel electrodes on the substrate when viewed in a plan view;
   an insulating film that is provided between the pixel electrodes and the counter electrodes;
   a plurality of signal lines that are provided on the substrate, on a side opposite to the counter electrodes with respect to the pixel electrodes, each of the signal lines being connected with any one of the counter electrodes so that a touch driving signal is supplied to the signal lines;
   a plurality of switching elements that are connected with the pixel electrodes, respectively,
   wherein each of the switching elements includes a gate electrode, a source electrode, and a drain electrode;
   an organic insulating film that is provided between the pixel electrodes and the signal lines as well as the switching elements,
   wherein each of the signal lines is in contact with the substrate;
   a first inorganic insulating film that covers each of the signal lines so as to be provided between the signal lines and the gate electrodes;
   a gate insulating film that covers the gate electrodes and the first inorganic insulating film; and
   a second inorganic insulating film that covers the source electrodes and the drain electrodes, and overlaps with the gate insulating film,
   wherein the organic insulating film is provided between the pixel electrodes and the second inorganic insulating film.

2. The touch-panel-equipped display device according to claim 1, wherein the active matrix substrate further includes, at each of positions that overlap with the signal lines when viewed in a plan view:
   a first metal film that is made of the same material as that of the gate electrode;
   a second metal film that is in contact with the first metal film, and is made of the same material as that of the source electrode and the drain electrode;
   a first transparent electrode film that is in contact with the second metal film, and is made of the same material as that of the pixel electrodes; and
   a second transparent electrode film that is in contact with the first transparent electrode film, and is made of the same material as that of the counter electrodes,
   wherein each of the signal lines is in contact with the first metal film.

* * * * *